US006975526B2

(12) United States Patent
Regev et al.

(10) Patent No.: US 6,975,526 B2
(45) Date of Patent: Dec. 13, 2005

(54) DETECTING "ALMOST MATCH" IN A CAM

(75) Inventors: Alon Regev, Woodland Hills, CA (US); Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 302 days.

(21) Appl. No.: 10/330,253

(22) Filed: Dec. 30, 2002

(65) Prior Publication Data

US 2004/0125632 A1 Jul. 1, 2004

(51) Int. Cl.[7] ............................................. G11C 15/04
(52) U.S. Cl. ................................. 365/49; 365/189.09
(58) Field of Search ........................... 365/49, 189.09, 365/189.03, 189.07

(56) References Cited

U.S. PATENT DOCUMENTS 5,964,857 A  * 10/1999 Srinivasan et al. ......... 710/244
6,249,449 B1 *  6/2001 Yoneda et al. ................. 365/49
6,307,767 B1 * 10/2001 Fuh ............................... 365/49

* cited by examiner

Primary Examiner—Anh Phung
Assistant Examiner—Hien Nguyen
(74) Attorney, Agent, or Firm—Dickstein Shapiro Morin & Oshinsky LLP

(57) ABSTRACT

An apparatus and method is disclosed for detecting CAM words having a "near match" condition, where "near match" is defined by a CAM word having one or more mismatching bits. Each cell in a CAM word is connected to a match line, where a small known current is impressed upon the line each time a bit does not match with search data. The total current is sensed to establish a priority for each respective CAM word. Each priority for each CAM word is then decoded to determine the Cam word having the highest priority. Under an alternate embodiment, a minimum priority level select circuit is disclosed, where a user may specify an acceptable priority level that is generated from a CAM word search.

22 Claims, 12 Drawing Sheets

| FIG. 1A | FIG. 1B |

| FIG. 1A | FIG. 1B |

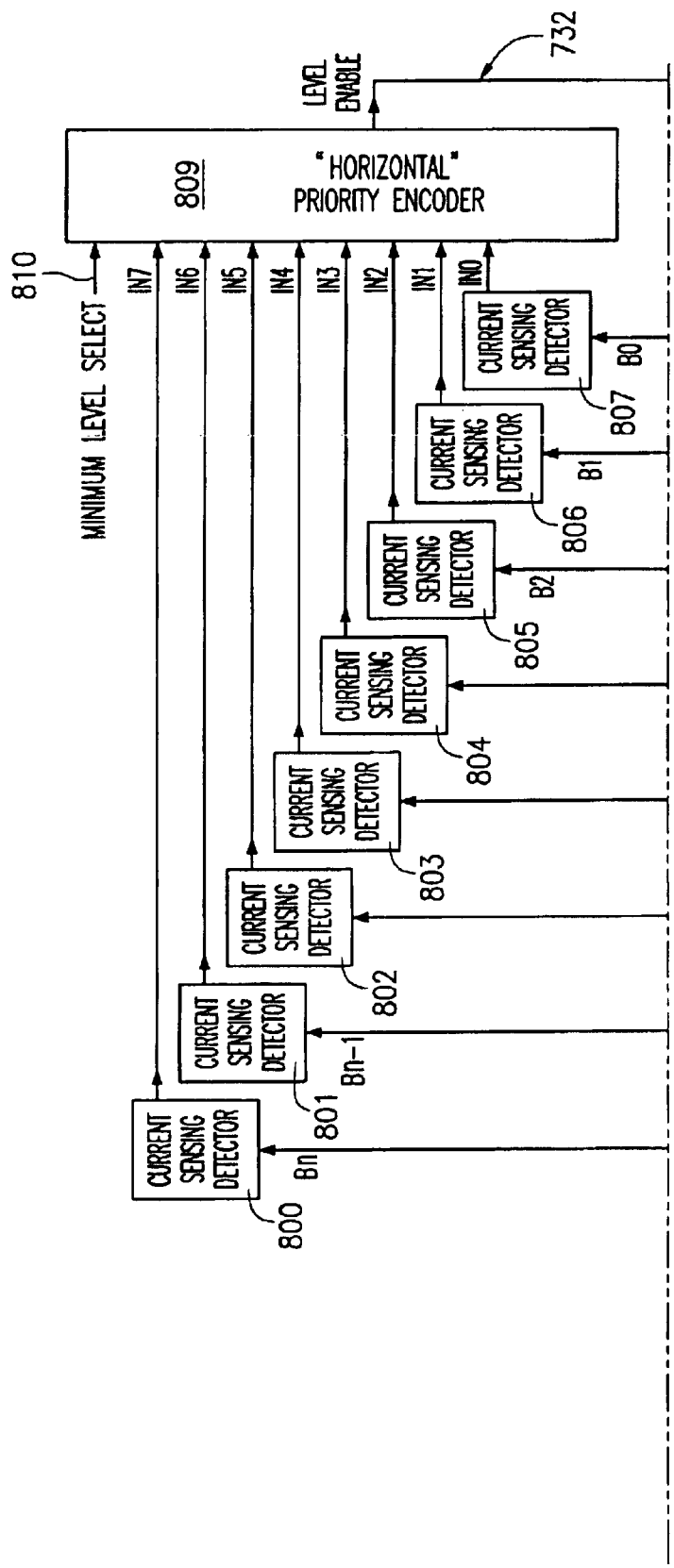

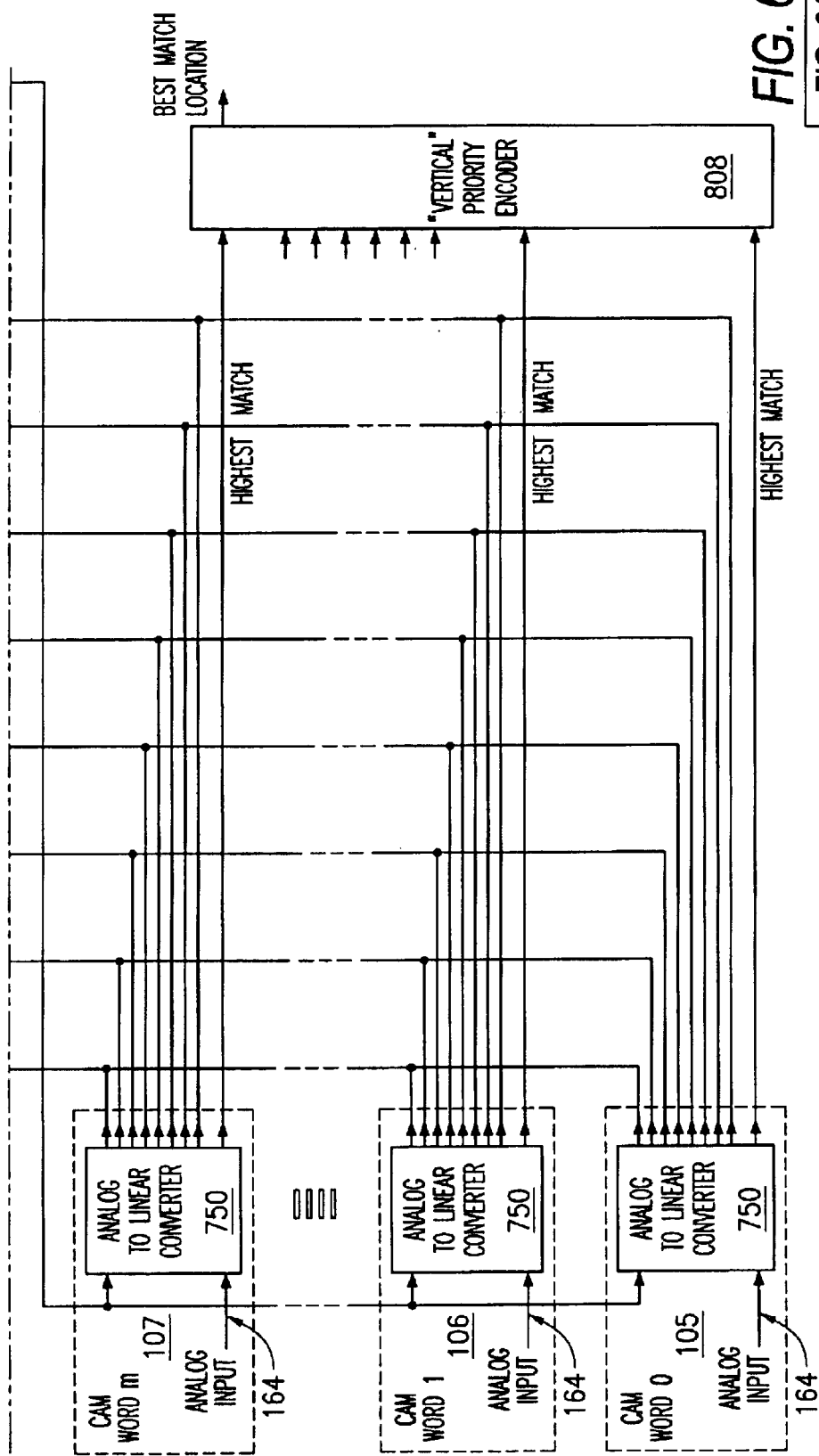

DETECTING "ALMOST MATCH" IN A CAM

FIELD OF THE INVENTION

The present invention relates generally to semiconductor memory devices and, more particularly to priority resolvers, and match detection in a content addressable memory (CAM) device.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A conventional CAM is viewed as a static storage device constructed of modified RAM cells. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers, gateways and switches, computer systems and other devices that require rapid content searching, such as routing tables for data networks or matching URLs. Some of these tables are "learned" from the data passing through the network. Other tables, however, are fixed tables that are loaded into the CAM by a system controller. These fixed tables reside in the CAM for a relatively long period of time. A word in a CAM is typically very large and can be 96 bits or more.

In order to perform a memory search in the above-identified manner, CAMs are organized differently than other memory devices (e.g., DRAM and SRAM). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has one of a pair of status bits that keep track of whether the location is storing valid information in it or is empty and available for writing.

Once information is stored in a memory location, it is found by comparing every bit in memory with data in the comparand register. When the contents stored in the CAM memory location does not match the data in the comparand register, the local match detection circuit returns a no match indication. When the contents stored in the CAM memory location matches the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address location in which the desired data is stored or one of such addresses, if more than one address contained matching data. Thus, with a CAM, the user supplies the data and gets back the address if there is a match found in memory.

Conventional CAMs use priority encoders to translate the physical location of a searched pattern that is located to a number/address identifying that pattern. Typically, priority encoders are designed as a major block common to the whole device. Such a design requires conductors from virtually every word in the CAM to be connected to the priority encoder. Typically, a priority encoder consists of two logical blocks—a highest priority indicator and an address encoder.

A priority encoder is a device with a plurality of inputs, wherein each of the inputs has an assigned priority. When an input is received on a high priority line in a highest priority indicator, all of the inputs of a lesser priority are disabled, forcing their associated outputs to remain inactive. If any number of inputs are simultaneously active, the highest priority indicator will activate only the output associated with the highest priority active input, leaving all other outputs inactive. Even if several inputs are simultaneously active, the priority encoder will only indicate the activity of the input with the highest priority. The priority address encoder is used in the CAM as the means to translate the position (within the CAM) of a matching word into a numerical address representing that location. The priority address encoder is also used to translate the location of only one word and ignore all other simultaneously matching words. However, conventional CAM priority systems have been unable to simultaneously resolve multiple CAM words having mismatching bits.

A need exists in the art to effectively resolve "imperfect" matches, that is, stored CAM words that may match only a certain number of bits of the data in the comparand, but do not match every bit. Such CAM words are referred to as having a "near match" condition. A CAM word capable of detecting a near match condition is also known in the art as a "correlator," where two patterns are correlated against each other. In prior art CAMs, a search for the nearest match is performed in one of two ways. In the first method, using binary CAMs, if an exact match is not found on the full between the stored word and the level of correlation between the two patterns reflects the number bits in the two patterns that are identical in both patterns. Typically the level of correlation between two patterns is given as the percentage of correlation, wherein 100% correlation indicates a perfect match between the two correlated patterns.

In data network communication, CAMs are also used as a tool for searching in the database of a network's client addresses. These searches typically require a pattern of bits to match exactly (i.e., 100%) with the searched pattern. For this reason, prior art CAMs search for a full match between every bit stored in a word and every unmasked bit in the comparand register, with certain bits in the comparand being masked. Search operations are repeated in an attempt to find a shorter match. If one bit of the comparand is masked at a time, then finding the longest possible match may require many repeated and undesirable operations/searches. In the present invention, the CAM is modified to allow less than 100% of correlation, and thus enable the use of a CAM in applications of pattern recognition, which do not require 100% correlation, but require a known high percentage of correlation between patterns. Such a high percentage of correlation means that only very few bits do not match between two patterns and a "near match" condition exists.

BRIEF SUMMARY OF THE INVENTION

The present invention provides a CAM match detection circuit that resolves multiple CAM words having "near match" conditions. In accordance with an exemplary embodiment of the invention, a priority resolver is disclosed that establishes "near match" detection on a group of CAM words. An analog priority converter and analog to linear converter are also illustrated, which help the CAM system to identify CAMs in a "near match" condition. In another exemplary embodiment of the invention a CAM word is disclosed that allows a small, known current to flow on a match line when mismatches are detected. In yet another exemplary embodiment a correlator system is disclosed which establishes a level of correlation among matched CAMs according to the number of mismatching bits.

BRIEF DESCRIPTION OF THE DRAWINGS

The above and other features and advantages of the invention will be more readily understood from the following detailed description of the invention which is provided in connection with the accompanying drawings.

FIG. 6 illustrates an embodiment of a bidirectional priority resolver/encoder used in the alternate embodiment;

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figures 1, 1A:
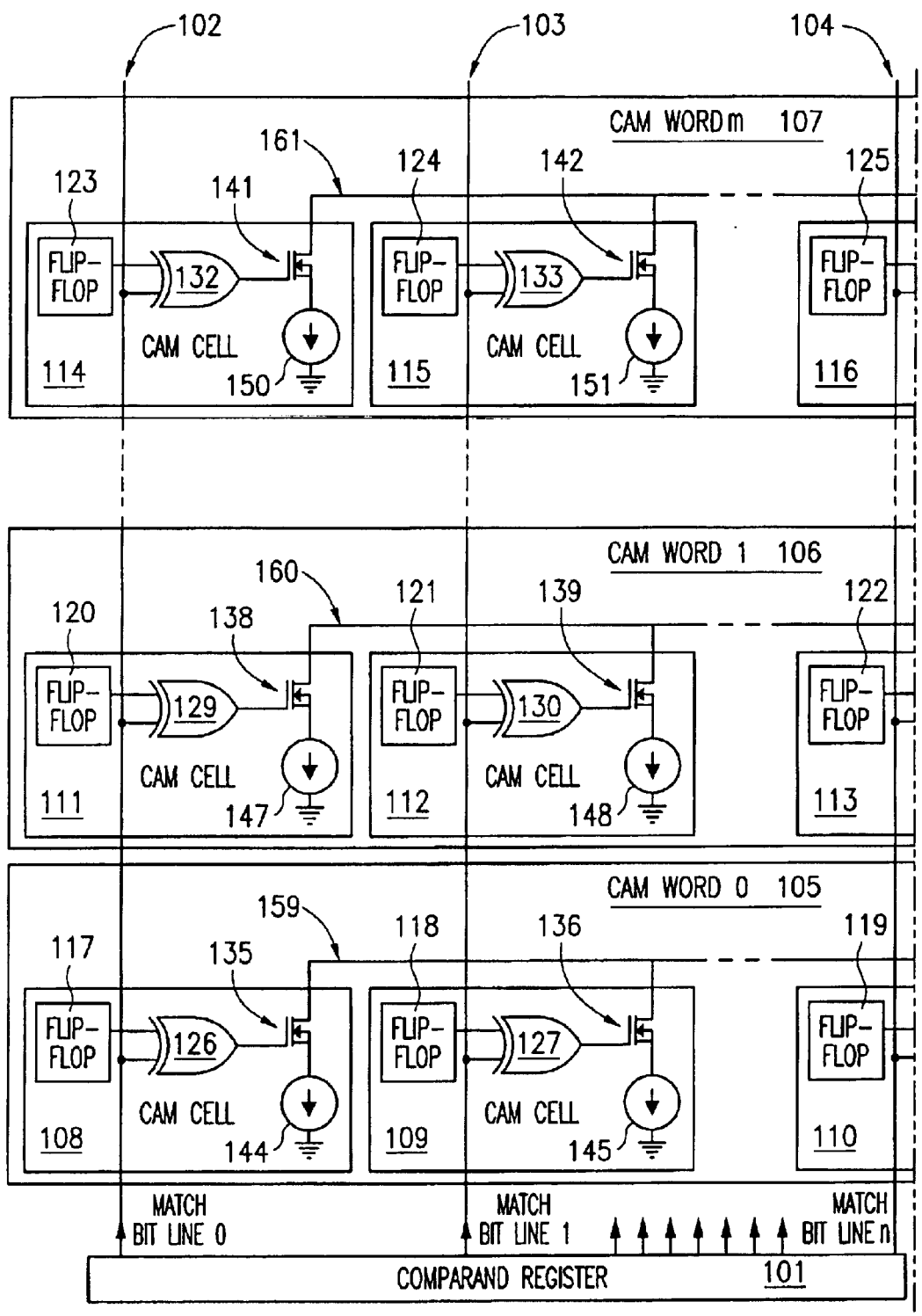
FIG. 1 illustrates a modified CAM system that determines a "near match" for a plurality of CAM words.
Figures 1, 1B:
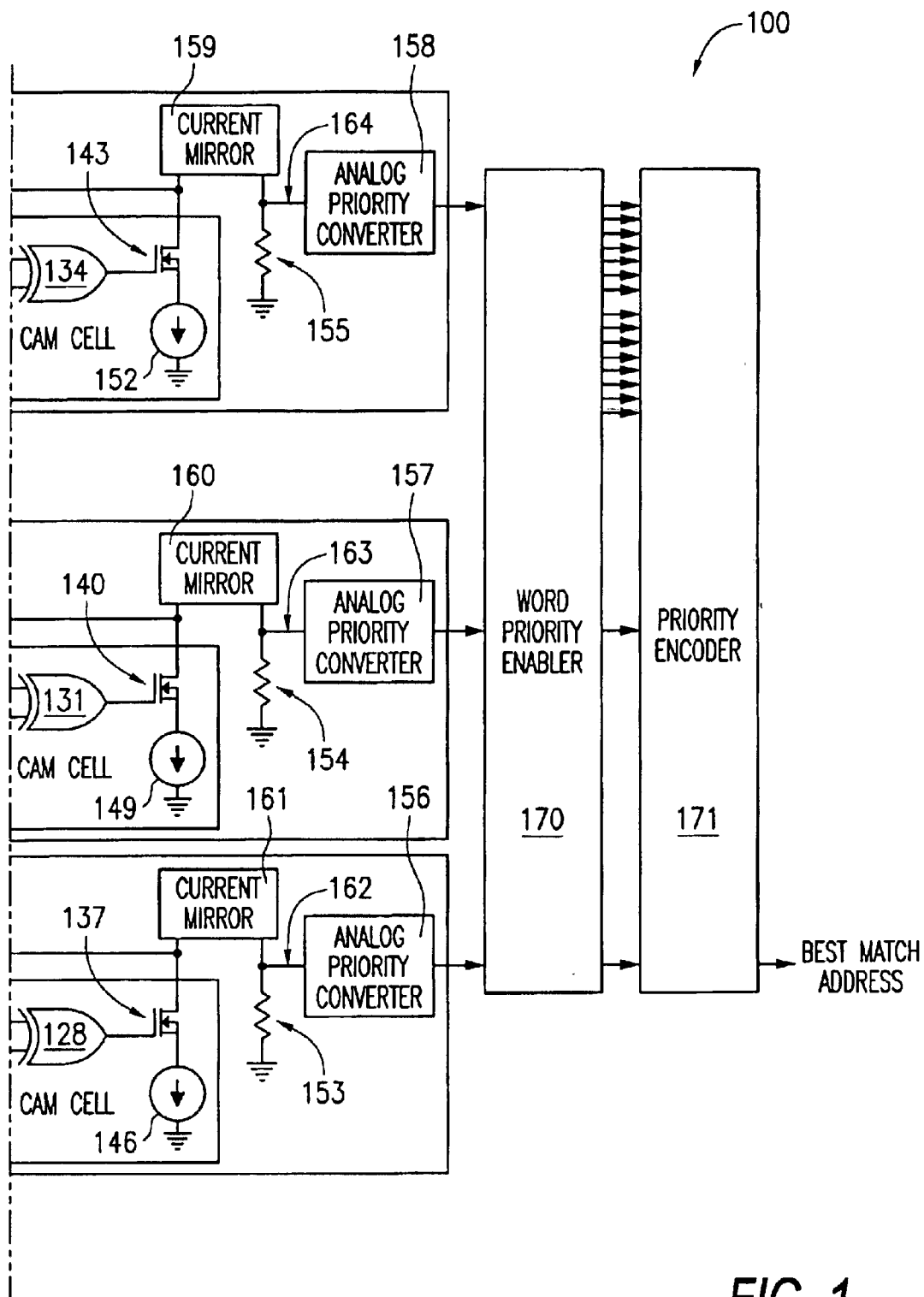

FIG. 1 illustrates a plurality of modified CAM words (105–107) configured to enable the detection of a "near-match" condition, meaning that all but a few bits in the CAM word match the bits stored in the comparand register 101. When the number of mismatching bits is determined, the CAM system then correlates a priority to the CAM word(s) with the least number of mismatching bits, whereas the fewer are the mismatching bit the higher is the priority of that CAM word. Each modified CAM word (105–107) is comprised of n-bit CAM cells (108–116), in which each CAM cell (108–116) in each CAM word (105–107) is connected to one end of a respective current mirror circuit (159–161). The other end of each current mirror circuit (159–161) is connected to a respective resistor (153–155) and inputs a signal into the CAM word analog priority converter (156–158). The output of each analog priority converter (156–158) is then inputted to word priority resolver 170, which sends an output to priority encoder 171 as shown in FIG. 1. Priority encoder 171 then outputs an address of the CAM word (105–107) having the nearest, or "best" match.

Each CAM cell (108–116) is comprised of a flip-flop (117–125) which serves as a bit storage element. Each flip-flop is connected to one terminal of an XOR gate (126–134), with the other terminal of each XOR gate (126–134) being connected to a respective bit line (102–104) from the comparand register 101. Each XOR gate (126–134) compares the data in a flip-flop (117–125) to the data on a bit line (102–104) as shown in FIG. 1. If the data in the flip-flop does not match the data on the bit line, each XOR (126–134) outputs a logic "1" signal, which turns on a respective transistor (135–143). Each transistor (135–143) is also coupled to a current source (144–152) which is further coupled to ground. Each current source (144–152) operates to limit the flow of current through each transistor. The output of transistors from each CAM cell (108–116) in each CAM word (105–107) are then connected together at each match line (159–161) as shown in FIG. 1 and are connected to a current mirror circuit (159–161), wherein each current mirror circuit (159–161) is further connected to a resistor (153–155).

When a perfect match exists among the data stored in a CAM word (105–107) and the data from the comparand register 101, the outputs of all the XOR gates in a cell (e.g., 132–134) are "0." As a result, all the transistors (141–143) are turned off, and no current flows through the respective match line (161). However, for every single bit that does not match the data in the comparand register 101, the signal from the respective XOR gate (126–134) will activate a transistor (135–143), causing current to flow along the match line (159–161). The current then flows through a current mirror circuit (159–161) and across a resistor 153–155, which generates a voltage across a node line (162–164). As more mismatching bits are detected, more transistors are activated, resulting in more current being placed on a respective match line (159–161). Accordingly, as the current increases, the voltage across each affected resistor and node line increases. For every q bits that do not match, the current is increased by a factor of q. The voltage across each resistor then, is a linear function of the number of mismatching bits present in a CAM word.

Figure 2:
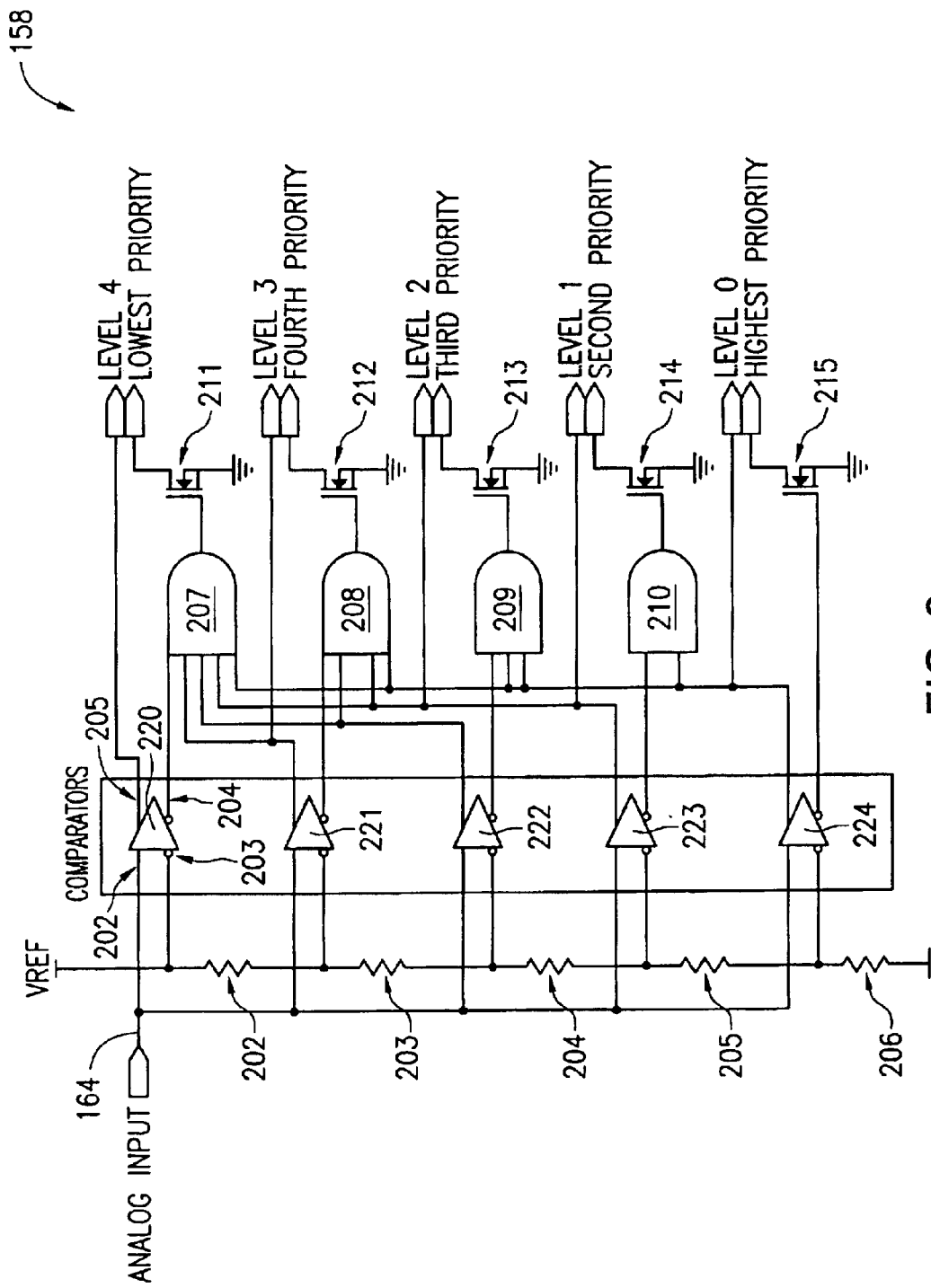
FIG. 2 illustrates an embodiment of an analog priority converter used in the FIG. 1 embodiment.

An analog priority converter (156–158) is connected to each of the voltage nodes connected to each resistor (153–155). A more detailed description of a priority converter 158 is shown in FIG. 2. In the converter 158, a reference voltage (VREF) is divided among a plurality of resistors (202–206) to form a resistive reference voltage divider. A plurality of comparators (220–224) are connected between each of the resistors (202–206), with each comparator having an inverting input 203 connected to a node above a resistor 206, and a non-inverting input 202 connected to the ANALOG INPUT line 164. The voltage on input line 164 is transmitted from the voltage generated across a respective resistor 155 in each CAM word (e.g., 107 of FIG. 1).

When the voltage on input signal 164 is sensed at the non-inverting node 202 of a comparator 220 as being higher than a reference voltage present on an inverting node 203, the non-inverting output 205 of the respective comparator will output a logic "1" signal, while the inverting output 204 outputs a logic "0." When the voltage on input signal 164 is sensed at the non-inverting node 202 of a comparator 220 as being lower than a reference voltage present on an inverting node 203, the non-inverting output 205 of the respective comparator will output a logic "0" signal, while the inverting output 204 outputs a logic "1." AND gates 207–210 are connected to the comparators 220–224 such that lower voltages on the ANALOG INPUT signal line 164 are given a higher priority than higher voltages, since a lower voltage detected across the line (e.g., LEVEL 1) causes the gates associated with the higher voltages (e.g., 207–209) to be disabled. As described above in connection with FIG. 1, the lower the voltage on signal line 164, the fewer mismatches exist in the CAM word (107) associated with the signal line.

Figure 3:
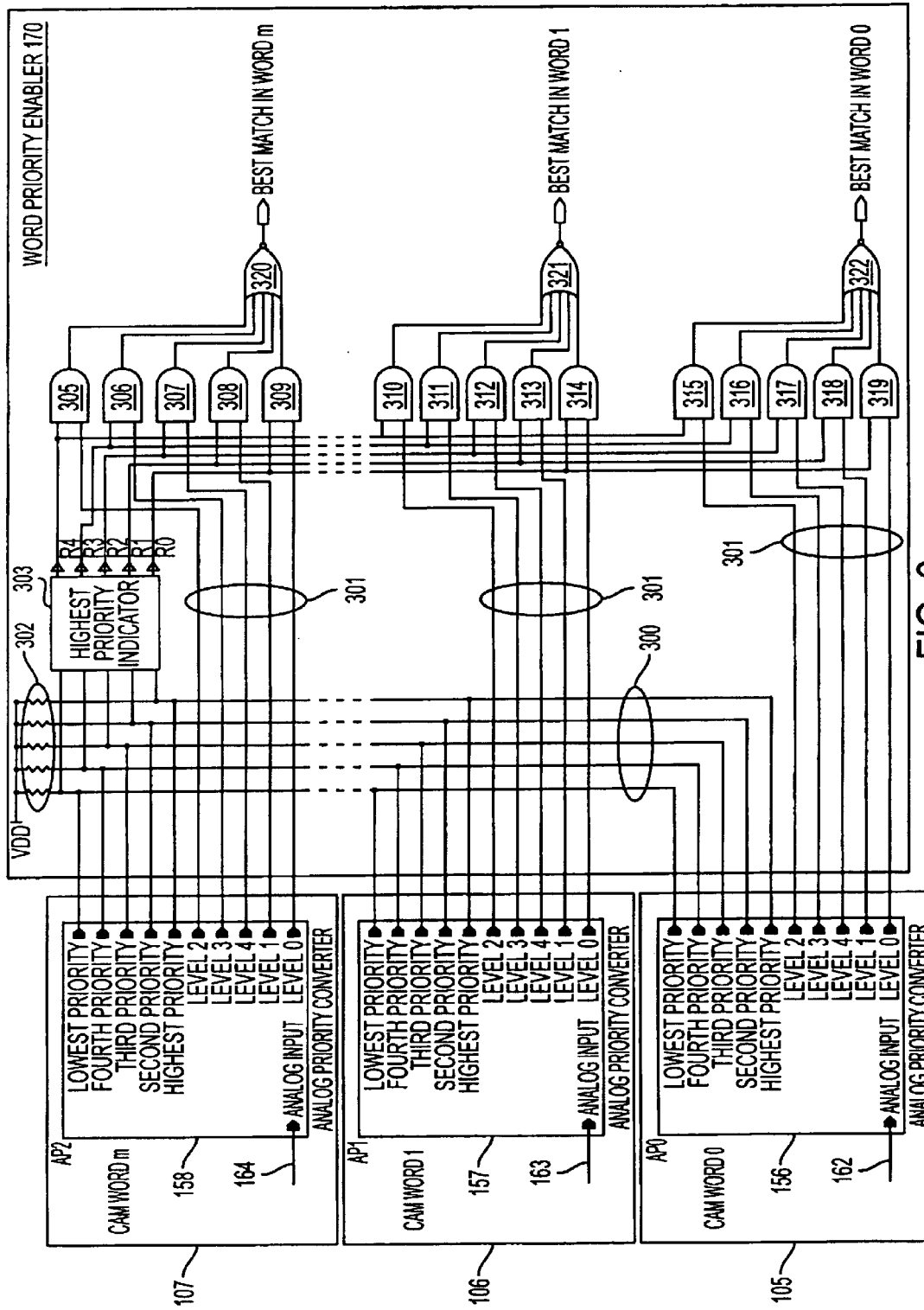
FIG. 3 illustrates a word priority enabler, used in the FIG. 1 embodiment.

FIG. 3 discloses an exemplary embodiment of a word priority enabler 170, which resolves priorities in matching words. As each CAM word 105–107 is tested for matching bits, each analog input signal 162–164, indicating the level (if any) of mismatching, is transmitted to each respective priority converter 156–158. As described above, each of the analog priority converters 156–58 output priority signals 300, which are each connected together in parallel as shown in FIG. 3. Since each priority signal in each CAM word is connected together, the presence of voltage on any one or more of the lines sets the entire signal line to that voltage (i.e., a logical OR function is performed throughout each priority line). LEVEL priority lines 301 are output to a first terminal of a respective AND gate associated with the CAM word (315–319, 310–314, and 305–309). The output from each group of AND gates associated with each CAM word is then combined at a respective NOR gate (320–322) for that word. The output from the NOR gates (320–322) identify the word with the best match.

Figure 3A:
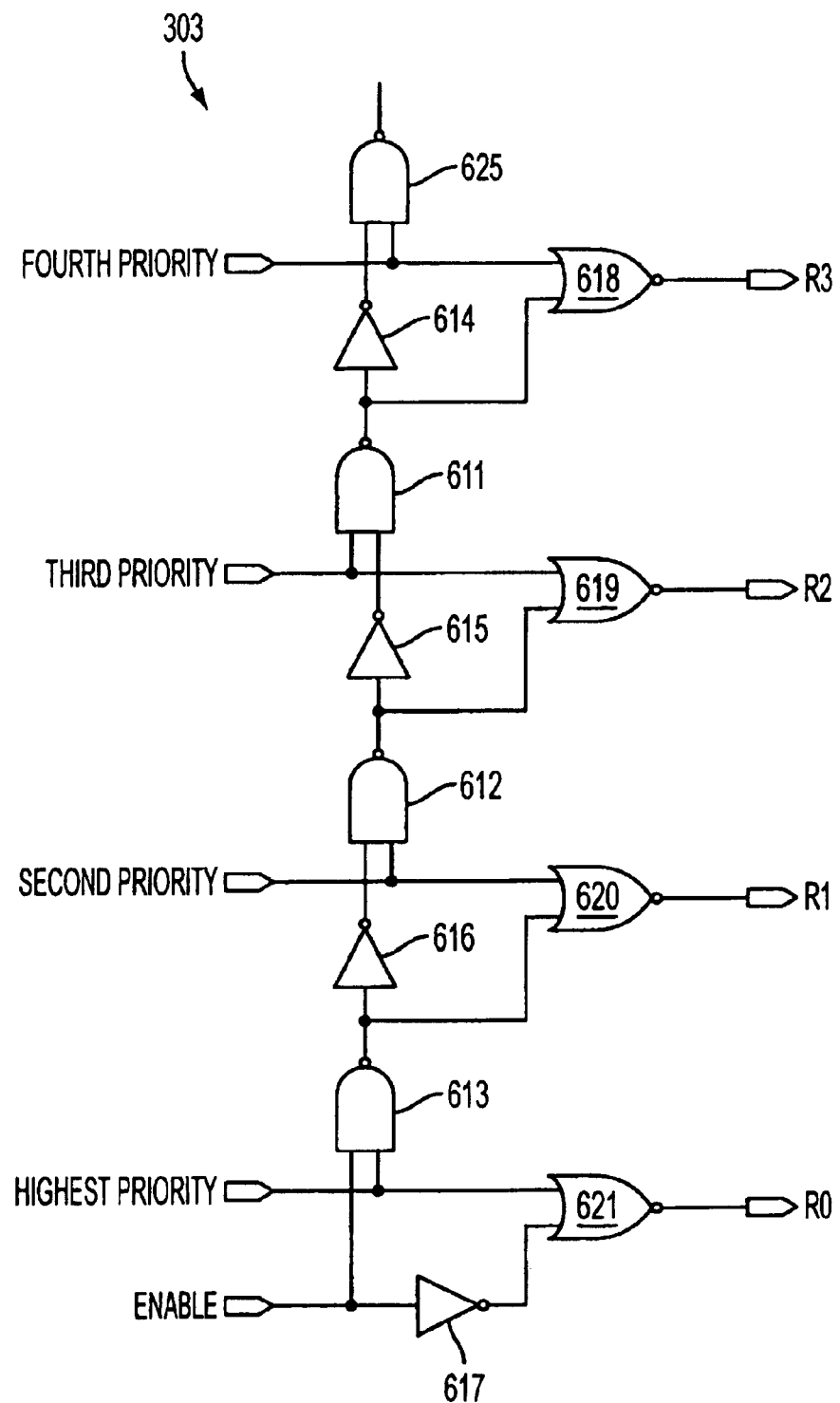
FIG. 3A illustrates a priority encoder, used in the FIG. 1 embodiment.

Each of the priority signals 300 in FIG. 3 are further connected to a resistor 302, wherein the voltage across a resistor 302 is sensed (not shown) and inputted into the highest priority indicator circuit 303. The output from the highest priority indicator circuit 303 will indicate the level of matching between data in a word throughout the CAM and the data in the comparand register 101. FIG. 3A discloses in greater detail a portion of the highest priority indicator 303. Each input line shown (HIGHEST—FOURTH PRIORITY) is connected to an input terminal of NOR gates 618–621 and NAND gates 625, 611–613. The output of each NAND gate 611–613 is shown as being inputted into a second terminal of NOR gates 618–620, respectively. The output of each NAND gate 611–613 is further inverted by inverters 614–616 and transmitted to adjacent NAND gates 625, 611–612, as shown in FIG. 3A. The logic configuration in the highest priority indicator 303 is set so that, no matter how many inputs are simultaneously active, the indicator will output only one priority line (R0–R4), the one with associated with the highest priority active input, as the active line (logic "1").

With only one line being active at any one time, only one of the gates (305–319) associated with each CAM word will have an active terminal according to the output from the priority indicator 303. As a result, only the CAM words having the same high level of priority 301 will be allowed to pass through one or more of gates 305–319 to the output gates 320–322. The signals outputted from output gates 320–322 are then inputted to a priority encoder 171 (see FIG. 1), where the encoder converts the data to a physical address of the CAM showing the highest priority.

Figure 4:
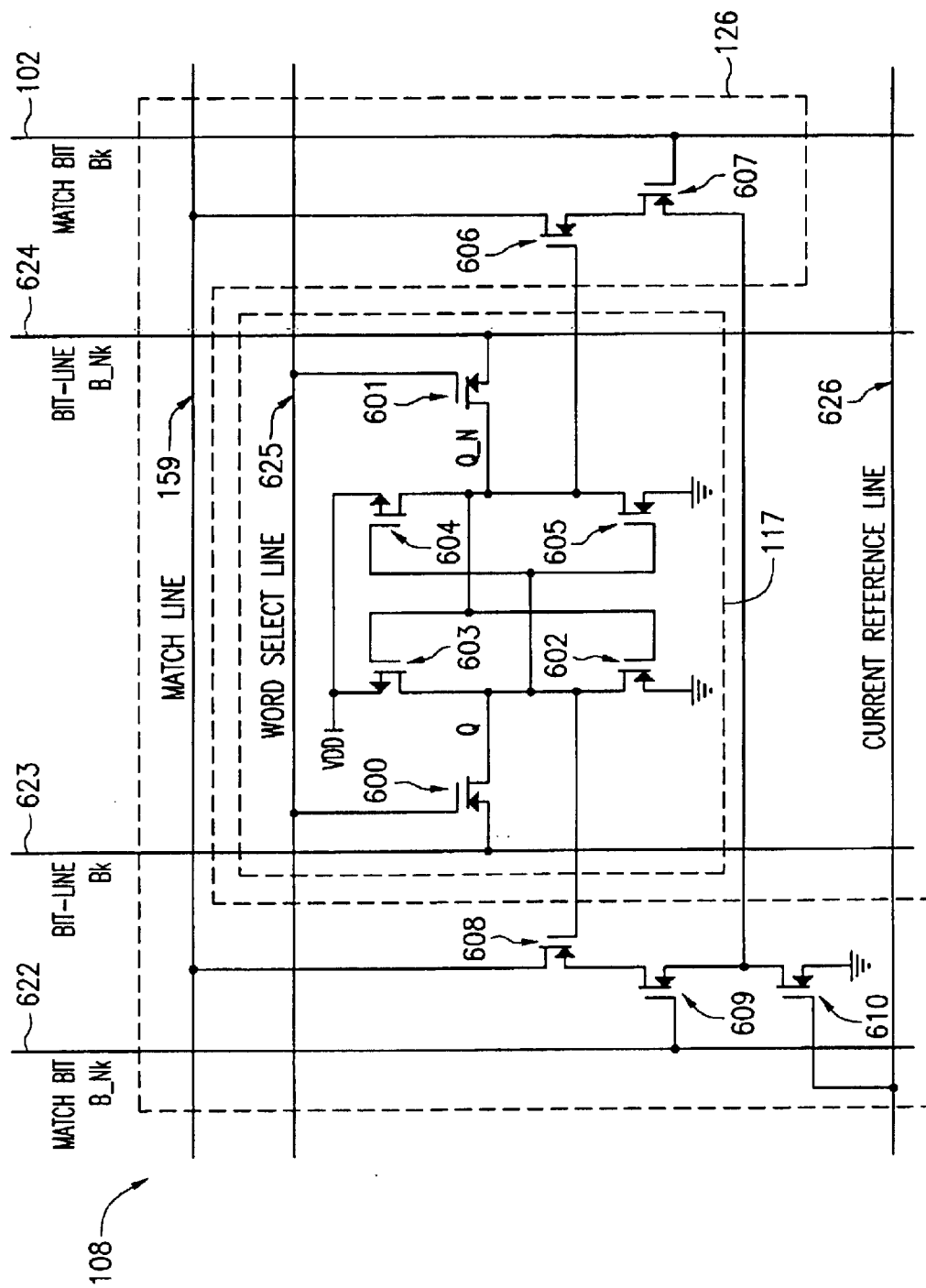
FIG. 4 illustrates an embodiment of a modified limited-current CAM cell under an alternate embodiment of FIG. 1.

FIG. 4 illustrates in greater detail an exemplary embodiment of a modified CAM cell 108 used under an alternate embodiment similar to FIG. 1, wherein the flip-flop (or "latch") portions 117 and the XOR portions 126 are schematically illustrated. The flip-flop portion 117 comprises of transistors 600–605, while the XOR portion comprises of transistors 606–610. The flip-flop portion stores a true logic state Q of a stored bit and a complementary logic state Q_N of the stored bit. The source terminals of transistors 603 and 604 are coupled to $V_{DD}$, and the source terminals of transistors 602 and 605 are coupled to ground, thereby enabling the writing of a logic HIGH (i.e., "1") and a logic LOW "(i.e., "0") in the flip-flop depending on the bit line 623, and 624. As is known in the art, the flip-flop is accessed when both the word select line 625 and column select line 623, and 624, are simultaneously activated.

Bit line 623, bit complement line 624, match bit line 102, match bit complement line 622 extend the whole length of a bit column and are common to all the bits in the column. Match line 159, word select line 625 and current reference line 626 extend throughout the whole width of the word and are common to all bits in the word. Match line 159 is connected to the drain terminals of transistors 608 and 606. The base terminals of transistors 608 and 606 are each connected to the Q and Q_N nodes, respectively, as shown in FIG. 4 The word select line is connected to the base terminal of transistors 600 and 601, wherein each source terminal of transistors 600 and 601 is connected to the bit line 623 and bit complement line 624, respectively as shown in FIG. 4. The match complement bit line 622 connects to the base terminal of transistor 609, while the match bit line 102 connected to the base terminal of transistor 607. Each drain terminal in transistors 609 and 607 connect to a respective source terminals of transistors 608 and 606. Each source terminal of transistors 609 and 607 is connected to a drain terminal of transistor 610, whose base terminal is connected to the current reference line 626. The source terminal of transistor 610 is coupled to ground.

During search operation, the logic state across match bit line B_Nk 622 is compared with the logic state of the stored bit Q, and the logic state of match bit line Bk102 is compared with the logic state of Q_N. If the logic state of match bit line 102 matches the logic state of Q, then match bit line 622 does match Q_N, as the lines 102 and 622 are complementary to each other. Therefore, at least one transistor in each of the series connected transistor pairs (609 & 610 or 606 & 607) is inactive, and therefore, the match line 159 does not have current flowing on it, signifying that a match has been detected. In practice, many stored bits are simultaneously compared with many inputs bits, and if all input bits match their associated stored bits, then the match line 159 remains inactive. However, once there is a mismatch, both transistors of at least one pair of series-connected transistors (609 & 610 or 606 & 607) will become active, allowing a small, know current to flow 6 through transistor 610, and then to the match line, through the least one pair of series-connected transistors (609 & 610 or 606 & 607). The magnitude of the current flowing through the transistor 610, is controlled by the voltage on the current reference line 626. As the match line passes through each CAM cell in the word, each mismatch in a respective CAM cell adds an additional current value to the match line FIG. 5 discloses an alternative embodiment of analog to linear converter 750, which may be used in place of the analog priority converters (156–158) illustrated in FIGS. 1 & 2. Similar to the analog priority converters (156–158), the analog to linear converter determines the level of mismatch between a CAM word and the data stored in the comparand register.

In the converter 750, a reference voltage (VREF) is divided among a plurality of resistors (710–714) to form a resistive reference voltage divider. A plurality of comparators (700–702) are connected between each of the resistors (710–714), with each comparator having an inverting input ("A") connected to a node above a respective resistor (206), and a non-inverting node ("B") connected to the ANALOG INPUT line 164. The voltage on input line 164 is transmitted from the voltage generated across a respective resistor 155 in each CAM word 105–107 shown in FIG. 1.

When the voltage on input signal 164 is sensed at the non-inverting node "B" of a comparator 700–704 as being higher than a reference voltage present on an inverting node "A", the non-inverting output (705B–708B) of the respective comparator will output a logic "1" signal, while the inverting output (705A–709A) outputs a logic "0." When the voltage on input signal 164 is sensed at the non-inverting node 202 of a comparator 220 as being lower than a reference voltage present on an inverting node 203, the non-inverting output (705B–708B) of the respective comparator will output a logic "0" signal, while the inverting output (705A–709A) outputs a logic "1."

Figure 5:
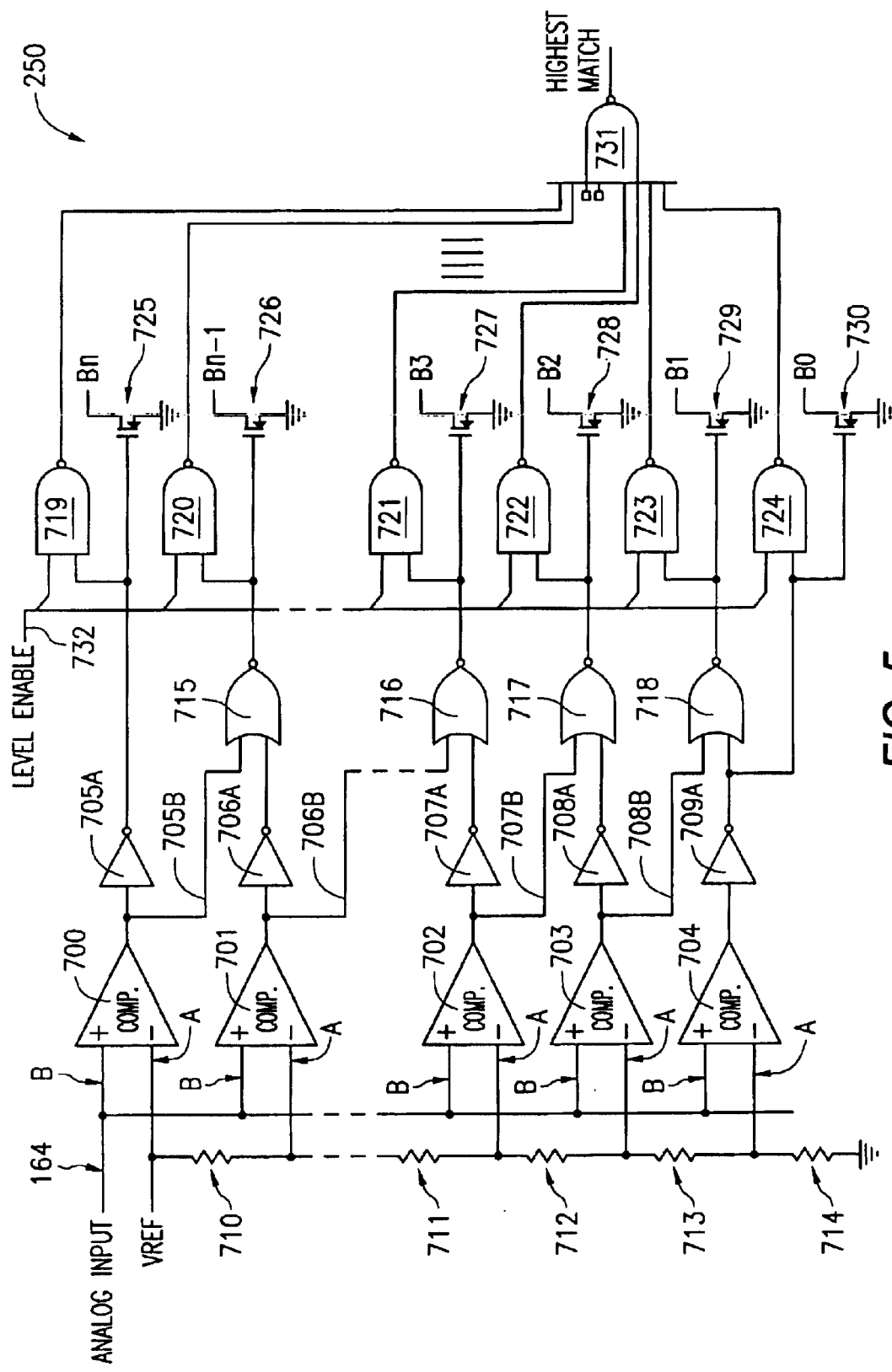
FIG. 5 illustrates an embodiment of an analog to linear converter used in the alternate embodiment.

Each inverting output (705A–709A) is connected to one input terminal of a respective NOR gate (715–718), with the exception of the inverted output of the lowest priority line 705A. The other input terminal of each NOR gate (715–718) is connected to the non-inverting output (705B–708B) of an adjacent comparator as shown in FIG. 5. The output of each NOR gate (719–724) is sent to a respective transistor 725–730, which allows a priority signal (B0–Bn) to flow when voltage in present on the line. The configuration of the analog to linear converter 750 is such that B0 has the highest priority, with each successive line (Bl–Bn) having a lesser priority than the last. Thus, any signals that are present on a higher priority line work to disable lower priority lines in FIG. 5.

FIG. 6 discloses a priority resolver circuit, utilizing the analog to linear circuit 750 of FIG. 5. Each CAM word 105–107 receives an analog input 164 into a respective analog to linear converter 750, as discussed above. Each converter has each respective output line (B0–Bn) coupled together in parallel as shown in FIG. 6, and connected to a respective current sensing detector (800–807). Current sensing detectors 800–807 typically comprise of resistors connected to a reference voltage, wherein a plurality of sense amplifiers sense the voltage across a respective resistor. The output of current sensing detectors 800–807 are then connected to a horizontal priority encoder 809, which determines a highest priority or priorities detected across each CAM word.

Figure 7:
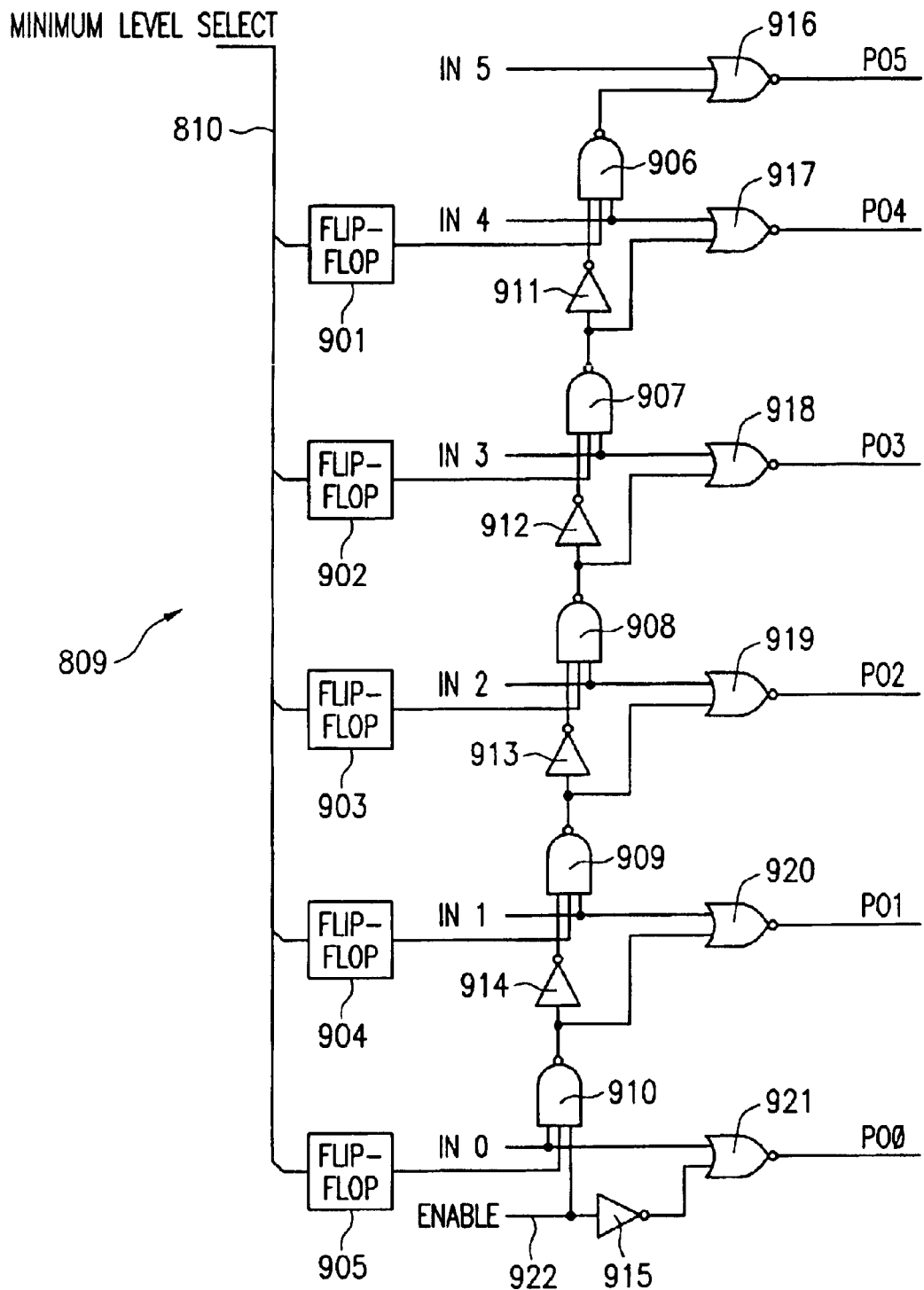
FIG. 7 illustrates an embodiment of a priority encoder with a selectable minimum priority level.

FIG. 7 discloses in greater detail another exemplary embodiment of the horizontal priority encoder 809 shown in FIG. 6. This horizontal priority encoder is similar the highest priority indicator shown in FIG. 3A, except that it is modified to reject any entries of a priority level lower than a prescribed minimum. As described earlier, the priority level is indicative of the level of correlation between data in a CAM word and data in the comparand register. Therefore rejecting entries of lesser priorities is setting the minimum level of correlation between the two data patterns. A minimum level select line 810 is coupled to the input of priority encoder 809, wherein flip-flops 901–905 store data pertaining to a minimum priority level that is manually entered by a user. The priority level set by the user will operate to limit the priority signals outputted by priority encoder 809. The output of each of the flip-flops is coupled to an input terminal of a respective NAND gate (906–910). A second terminal of each NAND gate (906–910) is coupled to a line (IN0–IN5) receiving the output from a respective sensing circuit (800–807). Input lines IN0–IN5 are further coupled to an input terminal of NOR gates 910–916 as shown in FIG. 7.

The outputs of each NAND gates 906–910 are each coupled to an input terminal of an adjacent NOR gate as shown in FIG. 7. The outputs of each NAND gates 906–910 are further coupled to a respective inverter (911–914), which is further coupled to an input terminal of an adjacent NAND gate as shown in FIG. 7. When all of the inputs for encoder 809 have been received, enable signal 922 is transmitted to the highest priority NAND gate 910, and to inverter 915, which is further coupled to NOR gate 921. Each flip-flop can effectively mask the bits being encoded, by transmitting a logic "0" signal to a NAND input, and thus disabling the output of the respective NAND (906–910). Thus, only the selected priority level will be allowed to pass through outputs $PO_0$–$PO_5$.

The resolved horizontal priority of each CAM word is then transmitted as a LEVEL ENABLE signal across feedback line 732, and connected to each analog to linear converter 750 in each CAM word (105–107) to generate a HIGHEST MATCH output. FIG. 5 discloses in greater detail how the HIGHEST MATCH output is generated. The level enable line is connected to one input terminal of each NAND gate (719–724) in the analog to linear converter 750. The other input terminal of each NAND gate (719–724) is connected to the output of each NOR gate (715–718), with the exception of the lowest and highest priority lines (Bn, B0 respectively), wherein the input terminal to the associated NAND gate (719, 724) is connected to the inverting output (705A, 709A) of the comparator (700, 704).

All of the outputs from NAND gates 719–724 are then connected to NAND gate 731, wherein a HIGHEST MATCH output is given if the CAM word matches the level of priority enabled across line 732. Each of the highest match signals are then connected to the vertical priority encoder 808.

The vertical priority encoder is used as a means to convert a physical location of a CAM into a number identifying that location. In a typical application, a CAM may generate multiple match signals on active match lines in response to a search request. Typically, the match signals are sent to a priority encoder to determine the single address corresponding to the highest priority closest match.

Figure 8:
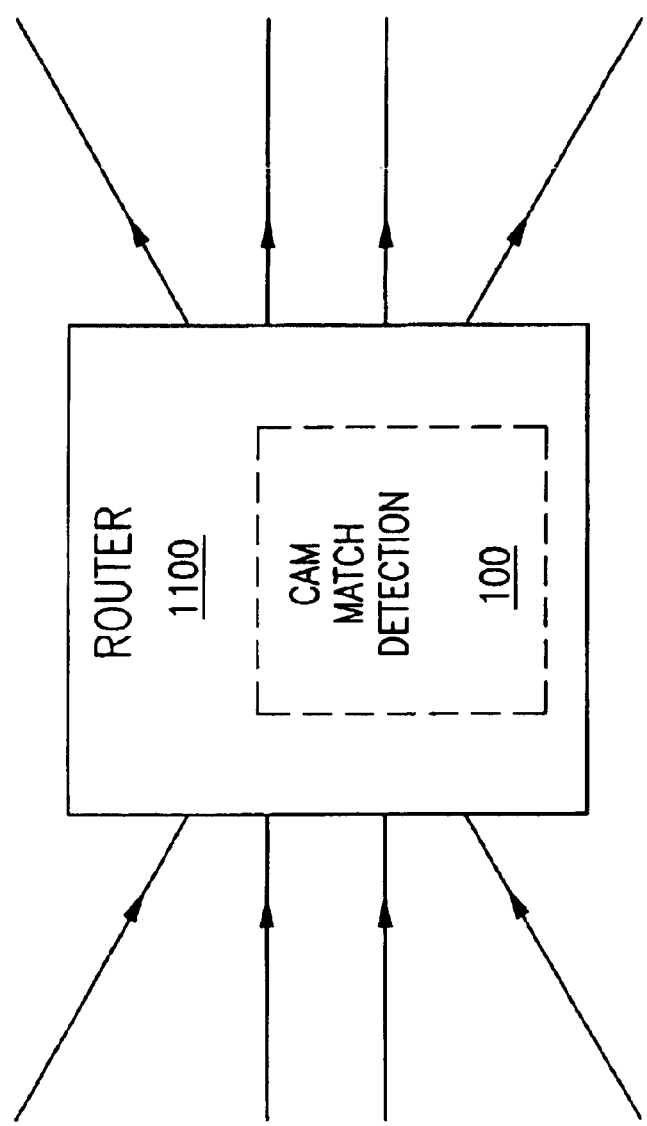
FIG. 8 depicts a simplified block diagram of a router employing the FIG. 1 embodiment in accordance with another exemplary embodiment of the invention.

FIG. 8 is a simplified block diagram of a router 1100 as may be used in a communications network, such as, e.g., part of the Internet backbone. The router 1100 contains a plurality of input lines and a plurality of output lines. When data is transmitted from one location to another, it is sent in a form known as a packet. Oftentimes, prior to the packet reaching its final destination, that packet is first received by a router, or some other device. The router 1100 then decodes that part of the data identifying the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 1100, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 8, router 1100 contains the added benefit of employing a semiconductor memory chip containing a CAM matching circuit 100, such as that depicted in FIG. 1. Therefore, the CAM has the benefit of providing "near match" detection and expanded pattern recognition, in accordance with an exemplary embodiment of the invention.

Figure 9:
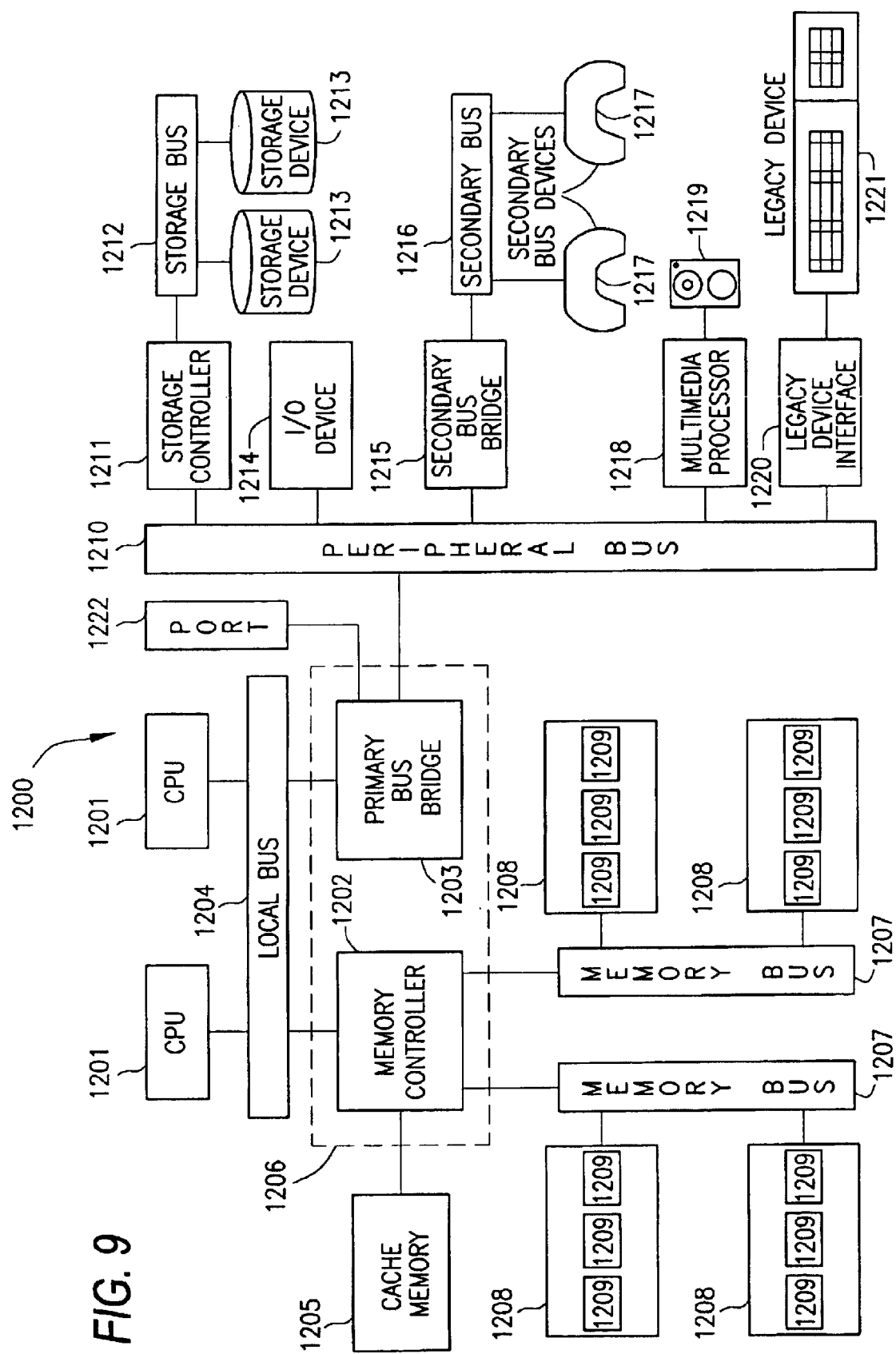
FIG. 9 depicts a block diagram of a processor system, in accordance with yet another exemplary embodiment of the invention.

FIG. 9 illustrates an exemplary processing system 1200 which utilizes a CAM match detection circuit such as, for example, the analog priority converters 156–158 and word priority enabler circuit 170 of FIG. 1. The processing system 1200 includes one or more processors 1201 coupled to a local bus 1204. A memory controller 1202 and a primary bus bridge 1203 are also coupled the local bus 1204. The processing system 1200 may include multiple memory controllers 1202 and/or multiple primary bus bridges 1203. The memory controller 1202 and the primary bus bridge 1203 may be integrated as a single device 1206.

The memory controller 1202 is also coupled to one or more memory buses 1207. Each memory bus accepts memory components 1208. Any one of memory components 1208 may contain a CAM array containing a match detection circuit such as any of the match detection circuits described in connection with FIGS. 1–7.

The memory components 1208 may be a memory card or a memory module. The memory components 1208 may include one or more additional devices 1209. For example, in a SIMM or DIMM, the additional device 1209 might be a configuration memory, such as a serial presence detect (SPD) memory. The memory controller 1202 may also be coupled to a cache memory 1205. The cache memory 1205 may be the only cache memory in the processing system. Alternatively, other devices, for example, processors 1201 may also include cache memories, which may form a cache hierarchy with cache memory 1205. If the processing system 1200 include peripherals or controllers which are bus masters or which support direct memory access (DMA), the memory controller 1202 may implement a cache coherency protocol. If the memory controller 1202 is coupled to a plurality of memory buses 1207, each memory bus 1207 may be operated in parallel, or different address ranges may be mapped to different memory buses 1207.

The primary bus bridge 1203 is coupled to at least one peripheral bus 1210. Various devices, such as peripherals or additional bus bridges may be coupled to the peripheral bus 1210. These devices may include a storage controller 1211, an miscellaneous I/O device 1214, a secondary bus bridge 1215, a multimedia processor 1218, and an legacy device interface 1220. The primary bus bridge 1203 may also coupled to one or more special purpose high speed ports 1222. In a personal computer, for example, the special purpose port might be the Accelerated Graphics Port (AGP), used to couple a high performance video card to the processing system 1200.

The storage controller 1211 couples one or more storage devices 1213, via a storage bus 1212, to the peripheral bus 1210. For example, the storage controller 1211 may be a SCSI controller and storage devices 1213 may be SCSI discs. The I/O device 1214 may be any sort of peripheral. For example, the I/O device 1214 may be an local area network interface, such as an Ethernet card. The secondary bus bridge may be used to interface additional devices via another bus to the processing system. For example, the secondary bus bridge may be an universal serial port (USB) controller used to couple USB devices 1217 via to the processing system 1200. The multimedia processor 1218 may be a sound card, a video capture card, or any other type of media interface, which may also be coupled to one additional device such as speakers 1219. The legacy device interface 1220 is used to couple legacy devices, for example, older styled keyboards and mice, to the processing system 1200.

The processing system 1200 illustrated in FIG. 8 is only an exemplary processing system with which the invention may be used. While FIG. 8 illustrates a processing architecture especially suitable for a general purpose computer, such as a personal computer or a workstation, it should be recognized that well known modifications can be made to configure the processing system 1200 to become more suitable for use in a variety of applications. For example, many electronic devices which require processing may be implemented using a simpler architecture which relies on a CPU 1201 coupled to memory components 1208 and/or memory devices 1209. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuits employing different configurations of p-type and n-type transistors, the invention may be practiced with many other configurations without departing from the spirit and scope of the invention. In addition, although the invention is described in connection with flip-flop memory cells and DRAM memory cells, it should be readily apparent that the invention may be practiced with any type of memory cell. It is also understood that the logic structures described in the embodiments above can substituted with equivalent logic structures to perform the disclosed methods and processes. Accordingly, the invention is not limited by the foregoing description or drawings, but is only limited by the scope of the appended claims.

What is claimed as new and desired to be protected by Letters Patent of the United States is:

1. A circuit for prioritizing a plurality of CAM words, comprising:
   a plurality of current detection circuits, each of said plurality of current detection circuits being coupled to a respective match line in each of said plurality of CAM words;
   a plurality of priority converter circuits, each of said plurality of priority converter circuits being coupled to a respective one of said plurality of current detection circuits for assigning a priority to each of said plurality of CAM words; and
   an encoding circuit coupled to each of said plurality of priority converter circuits, wherein said encoding circuit encodes an output from each converter circuit to determine a priority for all of said outputs.

2. The circuit according to claim 1, wherein the current detection circuit comprises a plurality of resistors, each of said resistors being coupled to the output of each of the match lines, each of said resistors generating a respective priority voltage on an output line when a respective current flows across each resistor.

3. The circuit according to claim 2, wherein each of the plurality of priority converter circuits comprises a plurality of comparators, each comparator having one input terminal connected to the priority voltage output line, and a second input terminal coupled to a reference voltage line.

4. The circuit according to claim 3, wherein the plurality of comparators are sequentially arranged along the match lines and reference lines, so that a first comparator represents a highest priority, and the last comparator represents a lowest priority.

5. The circuit according to claim 4, each of the plurality of comparators have an inverting and non-inverting output, wherein the non-inverting output of each comparator will output a logic signal "1" signal to a level priority line if the priority voltage output line is determined to be higher than the reference voltage line.

6. The circuit according to claim 5, each of the plurality of comparators have an inverting and non-inverting output, wherein the non-inverting output of each comparator will output a logic signal "0" signal to a level priority line if the priority voltage output line is determined to be lower than the reference voltage line.

7. The circuit according to claim 6, wherein the plurality of comparators are connected to a plurality of logic gates, each of said comparators being connected to a respective logic gate.

8. The circuit according to claim 7, wherein the logic gates operate to allow only the highest available priority comparator logic signal to be transmitted to a word priority output, while disabling any lower priority comparator logic signals that are received.

9. The circuit according to claim 8, wherein the word priority output from the logic gates is connected to a sense circuit.

10. The circuit according to claim 9, wherein the sense circuit is connected to a highest priority indicator circuit.

11. The circuit according to claim 10, wherein the output of the highest priority indicator circuit is connected to a plurality of priority logic gates associated with each CAM word.

12. The circuit according to claim 11, wherein each of the level priority lines from each CAM word being connected with a respective plurality of priority logic gates, said logic gates arranged to indicate the CAM word having the highest priority.

13. An apparatus for converting a priority for a CAM word, comprising:
 a mismatch line, said mismatch line being connected to the CAM word, wherein the mismatch line carries a signal indicating the number of mismatching bits in the CAM word;
 a plurality of comparator circuits, each having an output terminal, and each of said comparator circuits having a first terminal connected to the mismatch line;
 a mismatch reference voltage line, connected to a plurality of resistors, each of said plurality of resistors being coupled to a second terminal of a respective comparator circuit, wherein each comparator outputs a signal if the respective comparator determines that the mismatch line voltage is lower than the mismatch reference voltage line.

14. The apparatus according to claim 13, wherein the comparator circuits are arranged in a sequential order along the voltage lines where each comparator has a higher priority.

15. The apparatus according to claim 14, wherein each comparator outputs a logic "1" signal on a non-inverting output line if the voltage on the mismatch line is sensed to be higher than the voltage on the reference line.

16. The apparatus according to claim 14, wherein each comparator outputs a logic "0" signal on a non-inverting output line if the voltage on the mismatch line is sensed to be lower than the voltage on the reference line.

17. The apparatus according to claim 14, wherein the plurality of comparators are connected to a plurality of logic gates with output terminals, each of said comparators being connected to a respective logic gate.

18. The circuit according to claim 17, wherein the logic gates operate to allow only the highest available priority comparator logic signal to be transmitted from an output terminal to a word priority output, while disabling any lower priority comparator logic signals.

19. The circuit according to claim 18, wherein the word priority output from the logic gates is connected to a sense circuit.

20. The circuit according to claim 19, wherein the sense circuit is connected to a highest priority indicator circuit.

21. The circuit according to claim 20, wherein the output of the highest priority indicator circuit is connected to a plurality of priority logic gates associated with each CAM word.

22. The circuit according to claim 21, wherein each of the level priority lines from each CAM word being connected with a respective plurality of priority logic gates, said logic gates arranged to indicate the CAM word having the highest priority.

* * * * *

UNITED STATES PATENT AND TRADEMARK OFFICE
CERTIFICATE OF CORRECTION

PATENT NO.      : 6,975,526 B2
DATED           : December 13, 2005
INVENTOR(S)     : Alon Regev et al.

It is certified that error appears in the above-identified patent and that said Letters Patent is hereby corrected as shown below:

Column 2,
Line 38, "on the full" should read -- on the full bits --;
Line 39, "and the" should read -- and the comparand register, the --;
Line 40, "number bits" should read -- number of bits --;

Column 3,
Line 64, "fewer are the mismatching bit the higher is the" should read -- fewer the mismatching bits the higher is the --;

Column 5,
Lines 53-54, "with associated with" should read -- associated with --;

Column 6,
Line 32, "terminals" should read -- terminal --;
Line 37, "During search" should read -- During a search --;
Line 53, "know" should read -- known --;
Line 54, "the least" should read -- the at least --;

Column 7,
Line 31, "in present" should read -- is present --;
Line 44, "typically comprise" should read -- typically are comprised --;
Line 53, "similar the" should read -- similar to the --;

Column 8,
Line 8, "each NAND" should read -- each of NAND --;

UNITED STATES PATENT AND TRADEMARK OFFICE
CERTIFICATE OF CORRECTION

PATENT NO.    : 6,975,526 B2
DATED         : December 13, 2005
INVENTOR(S)   : Alon Regev et al.

It is certified that error appears in the above-identified patent and that said Letters Patent is hereby corrected as shown below:

<u>Column 9,</u>
Line 13, "coupled the" should read -- coupled to the --;
Line 35, "include" should read -- includes --;
Line 46, "an miscellaneous" should read -- a miscellaneous --;
Line 47, "an legacy" should read -- a legacy --;
Lines 48-49, "also coupled" should read -- also be coupled --;
Line 60, "an local" should read -- a local --;
Line 64, "an universal" should read -- a universal --; and
Line 65, "via to the" should read -- via the --.

Signed and Sealed this

Twenty-fifth Day of April, 2006

JON W. DUDAS
*Director of the United States Patent and Trademark Office*